(12) United States Patent
Hsu

(10) Patent No.: US 8,306,147 B2
(45) Date of Patent: Nov. 6, 2012

(54) 4X OVER-SAMPLING DATA RECOVERY METHOD AND SYSTEM

(75) Inventor: Chia-Hao Hsu, Hsinchu (TW)

(73) Assignee: Sunplus Technology Co., Ltd., Hsinchu (TW)

( * ) Notice: Subject to any disclaimer, the term of this patent is extended or adjusted under 35 U.S.C. 154(b) by 807 days.

(21) Appl. No.: 12/488,845

(22) Filed: Jun. 22, 2009

(65) Prior Publication Data
US 2009/0323853 A1 Dec. 31, 2009

(30) Foreign Application Priority Data
Jun. 26, 2008 (TW) ................................. 97123935 A

(51) Int. Cl.
*H04L 25/49* (2006.01)

(52) U.S. Cl. ........ 375/294; 375/373; 375/376; 375/374; 375/355; 375/327; 341/141; 341/143; 341/142; 341/123; 327/147; 327/148; 327/157; 327/45

(58) Field of Classification Search .................. 375/373, 375/376, 374, 294, 327, 355; 341/141, 143, 341/142, 123; 327/147, 148, 157, 45
See application file for complete search history.

(56) References Cited

U.S. PATENT DOCUMENTS

| 5,905,769 A | 5/1999 | Lee et al. | |
| 7,194,057 B2 * | 3/2007 | Lin | ................................. 375/375 |
| 2007/0248201 A1 * | 10/2007 | Ker et al. | ....................... 375/355 |

* cited by examiner

*Primary Examiner* — David Ometz
*Assistant Examiner* — Rahel Guarino
(74) *Attorney, Agent, or Firm* — WPAT PC; Justin King

(57) ABSTRACT

A 4× over-sampling data recovery system consists of a charge pump PLL, a 4× over-sampler, a data regenerator and a digital PLL. The charge pump PLL receives a clock signal and generates a plurality of multiplicative clock signals in response to the clock signal. The 4× over-sampler samples a serial data to generate a M-bit signal according to the plurality of multiplicative clock signals, wherein each bit in the serial data is sampled for four times. The data regenerator sequentially receives and combines two M-bit signals to generate a (M+N)-bit signal. The digital PLL divides the (M+N)-bit signal into (N+1) groups of M-bit data and selects a designated M-bit data from the (N+1) groups of M-bit data to generate a P-bit recovery data.

11 Claims, 14 Drawing Sheets

US 8,306,147 B2

4X OVER-SAMPLING DATA RECOVERY METHOD AND SYSTEM

FIELD OF THE INVENTION

The present invention relates to an over-sampling data recovery method and system, and more particularly, to a 4× over-sampling data recovery method and system.

BACKGROUND OF THE INVENTION

TMDS (Transition Minimized Differential Signaling) is a technology for transmitting high-speed serial data and is used by video interfaces, such as HDMI (High-Definition Multimedia Interface) and DVI (Digital Visual Interface).

In a receiver (Rx) with Transition Minimized Differential Signaling (TMDS) standards or High Definition Multimedia interface (HDMI) standards, a clock channel (e.g. channel C) for transmitting a clock signal and three color channels (e.g. channel [0:2]) for transmitting serial data of R, G, and B are usually adopted.

In accordance with TMDS standards and HDMI standards, the clock signal is 25~165 MHz while a data rate of the color channels is ten times the clock signal. That is, the color channel transmits a serial data with 10 bits during a clock cycle, and the receiver with TMDS standards or HDMI standards must recovery the serial data with 10 bits in the color channels respectively.

In order to improve the success rate of data recovery, an over-sampling data recovery method is typically adopted. For example, in U.S. Pat. No. 5,905,769 titled "System and method for high-speed skew-insensitive multi-channel data transmission", a 3× over-sampling data recovery method and system is disclosed.

Please refer to FIG. 1. FIG. 1 is a diagram illustrating a conventional 3× over-sampling data recovery system according to prior art. The data recovery system consists of a charge pump phase locked loop (PLL) 20, an over-sampler 26, and a digital PLL 30. The digital PLL 30 further includes a phase-aligning window 50, a detection logic circuit 52, a digital loop filter 54, and a phase-aligning finite state machine (FSM) 56. In addition, the charge pump PLL 20 receives a clock signal (CLK) 22, and the over-sampler 26 receives a serial data 28, e.g. any one serial data of the three color channels.

Furthermore, the charge pump PLL 20 receives the clock signal 22, and then generates twelve multiplicative clock signals 24 with a phase difference of 30 degrees to the over-sampler 26 by performing a 2.5× frequency multiplication on the clock signal 22. The over-sampler 26 samples the serial data 28 according to the multiplicative clock signals 24, so as to generate fourteen over-sampled data, i.e. the 14-bit data, to the phase-aligning window 50. The phase-aligning window 50 selects twelve over-sampled data from the 14-bit data as a 12-bit signal 62 and then selects four designated bits from the 12-bit signal 62 as a 4-bit signal 64 to be outputted. After that, the detection logic circuit 52 generates two phase detection signals, i.e. a phase-up signal (UPF) 66 and a phase-down signal (DOWNF) 68, to the digital loop filter 54 according to the 12-bit signal 62. The digital loop filter 54 then generates three phase correction recommendation signals, i.e. an UP signal (UPT) 70, a hold signal (HOLD) 72, and a down signal (DOWNT) 74, to phase-aligning FSM 56 according to the received phase-up signal 66 and the phase-down signal 68. Finally, the phase-aligning FSM 56 generates a phase selection signal 58 to the phase-aligning window 50 according to the up signal 70, the hold signal 72, and the down signal 74, and thereby the phase-aligning window 50 selects twelve over-sampled data from the 14-bit data as the 12-bit signal 62 and selects four designated bits from the 12-bit signal 62 as the 4-bit signal 64 to be outputted.

Please refer to FIG. 2A. FIG. 2A is a diagram illustrating 3× over-sampling data recovery according to prior art. The charge pump PLL 20 generates twelve multiplicative clock signals 24-1~24-12 with a phase difference of 30 degrees by performing a 2.5× frequency multiplication on the clock signal 22. Due to the serial data 28 having 10 bits 28-1~28-10 during a clock cycle, each bit of the ten bits can be sampled for three times by sequentially sampling the ten bits based on the rising-edges of the twelve multiplicative clock signals 24.

Please refer to FIG. 2B. FIG. 2B is a diagram illustrating 3× over-sampling data recovery according to prior art. When a 4-bit data is sequentially sampled based on the rising-edges of the twelve multiplicative clock signals 24, an over-sampled data with 12 bits, i.e. S[0], S[1] . . . , S[11], can be generated. Therefore, a 14-bit signal can be obtained by adding the over-sampled data with 12 bits, a latest over-sampled bit S'[11] of the previous over-sampled data, and a first over-sampled bit S"[0] of the next over-sampled data up.

For example, assume that the four bits 28-1, 28-2, 28-3, and 28-4 of the serial data 28 are 1, 0, 1, and 0. The first bit 28-1 is sequentially sampled according to the rising edges of the multiplicative clock signals 24-1, 24-2, and 24-3, wherefore S[0]=S[1]=S[2]=1. The second bit 28-2 is sequentially sampled according to the rising edges of the multiplicative clock signals 24-4, 24-5, and 24-6, wherefore S[3]=S[4]=S[5]=0. The third bit 28-3 is sequentially sampled according to the rising edges of the multiplicative clock signals 24-7, 24-8, and 24-9, wherefore S[6]=S[7]=S[8]=1. The fourth bit 28-4 is sequentially sampled according to the rising edges of the multiplicative clock signals 24-10, 24-11, and 24-12, wherefore S[9]=S[10]=S[11]=0. In other words, the serial data 28 and the multiplicative clock signals 24 are under a perfect synchronization. The 12-bit signal consists of S[0]~S[11], wherein S[0], S[4], S[7], and S[10] are selected from the 12-bit signal as the 4-bit signal. Accordingly, the four bits 28-1, 28-2, 28-3, and 28-4 of the serial data 28 are successfully recovered to their correct logic values, i.e. S[1]=1, S[4]=0, S[7]=1, and S[10]=0.

On the other hand, the detection logic circuit 52 uses three sampled data as a unit, and determines whether to output the phase-up signal (UPF) 66 or the phase-down signal (DOWNF) 68 according to the logic values of the 12-bit signal S[0]~S[11]. Since S[0]=S[1]=S[2]=1, S[3]=S[4]=S[5]=0, S[6]=S[7]=S[8]=1, and S[9]=S[10]=S[11]=0 under a perfect synchronization, the phase-up signal (UPF) 66 or the phase-down signal (DOWNF) 68 won't be outputted by the detection logic circuit 52. As a result, the hold signal (HOLD) 72 is received by the phase-aligning FSM 56, and the phase selection signal 58 notifies the phase-aligning window 50 to maintain the present phase selection.

Please refer to FIG. 2C. If the serial data 28 and the multiplicative clock signals 24 are under an imperfect synchronization, the 14-bit signal is listed below: S'[11]=1, S[0]=1, S[1]=1, S[2]=0, S[3]=0, S[4]=0, S[5]=1, S[6]=1, S[7]=1, S[8]=0, S[9]=0, S[10]=0, S[11]=1, and S"[0]=1. At this time the 12-bit signal consists of S[0]~S[11], wherein S[1], S[4], S[7], and S[10] are selected from the 12-bit signal as the 4-bit signal. The four bits 28-1, 28-2, 28-3, and 28-4 of the serial data 28 can be successfully recovered to their correct logic values, i.e. S[1]=1, S[4]=0, S[7]=1, and S[10]=0. However, due to S[0]=S[1]≠S[2], S[3]=S[4]≠S[5], S[6]=S[7]≠S[8], and S[9]=S[10]≠S[11], the detection logic circuit 52 outputs the phase-up signal (UPF) 66. As a result, the up signal (UPT) 70 is received by the phase-aligning FSM 56, and the phase selection signal 58 notifies the phase-aligning window 50 to change the phase selection, which makes the 12-bit signal consist of S'[11], S[0], S[1], S[2], S[3], S[4], S[5], S[6], S[7], S[8], S[9], and S[10]. Accordingly, S'[11]=S[0]=S[1], S[2]=S[3]=S[4], S[5]=S[6]=S[7], and S[8]=S[9]=S[10], which returns to the perfect synchronization again.

Generally speaking, the conventional over-sampling data recovery method and system usually adopts an odd over-sampling method and system, e.g. a 3× over-sampling method/system or a 5× over-sampling method/system, wherein such approaches must utilize a charge pump PLL with a frequency multiplication over 2.5 times. In addition, the abovementioned two methods/systems can only sample a serial data with 4 bits each time. Take the 3× over-sampling method/system for example, errors might be caused in the sampled data when the serial data skews too seriously, which results in a condition that the data cannot be correctly recovered.

SUMMARY OF THE INVENTION

It is therefore one of the objectives of the present invention to provide a 4× over-sampling data recovery method and a related system applied to a video interface, which utilizes a charge pump PLL with a lower frequency multiplication and is capable of sampling a serial data with more bits.

According to an exemplary embodiment of the present invention, a 4× over-sampling data recovery system. The 4× over-sampling data recovery system includes a charge pump phase locked loop (PLL), for receiving a clock signal and generating a plurality of multiplicative clock signals according to the clock signal; a 4× over-sampler, for sampling a serial data to generate a M-bit signal according to the plurality of multiplicative clock signals, wherein each bit in the serial data is sampled for four times; a data regenerator for generating a (M+N)-bit signal according to sequentially two of the M-bit signals received; and a digital PLL, for dividing the (M+N)-bit signal into (N+1) groups of M-bit data and selecting a designated M-bit data from the (N+1) groups of M-bit data as a P-bit recovery data.

According to another exemplary embodiment of the present invention, a 4× over-sampling data recovery method is provided. The 4× over-sampling data recovery method includes the following steps: receiving a clock signal, and generating a plurality of multiplicative clock signals in response to the clock signal; sampling a serial data to generate a M-bit signal according to the plurality of multiplicative clock signals, wherein each bit in the serial data is sampled for four times; sequentially receiving and combining two of the M-bit signals to generate a (M+N)-bit signal; dividing the (M+N)-bit signal into (N+1) groups of M-bit data; selecting a designated M-bit data from the (N+1) groups of M-bit data; and generating a P-bit recovery data in response to the designated M-bit data.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF THE PREFERRED EMBODIMENT

Figure 1:
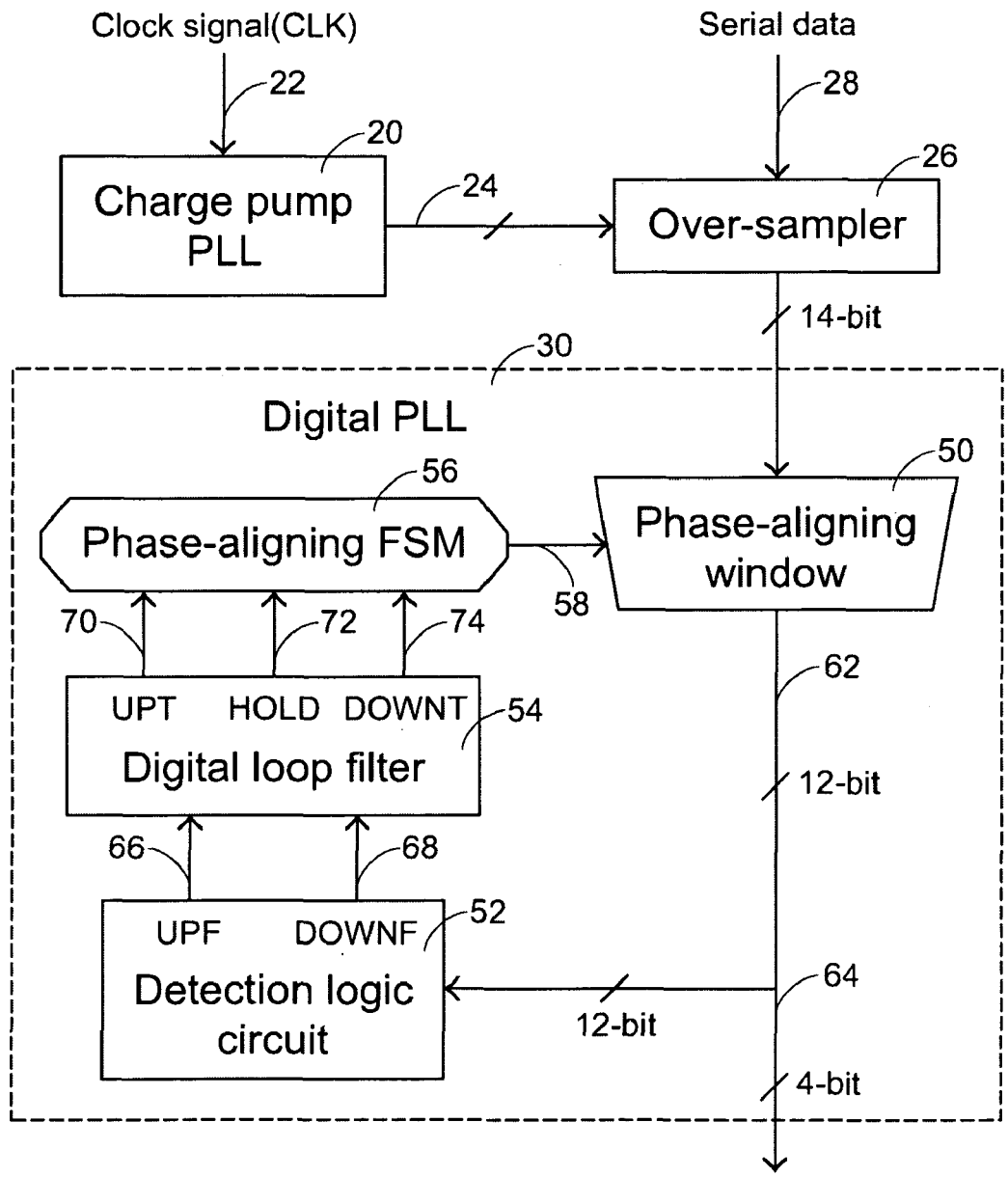
FIG. 1 is a diagram illustrating a conventional 3× over-sampling data recovery system according to prior art.
Figure 2A:
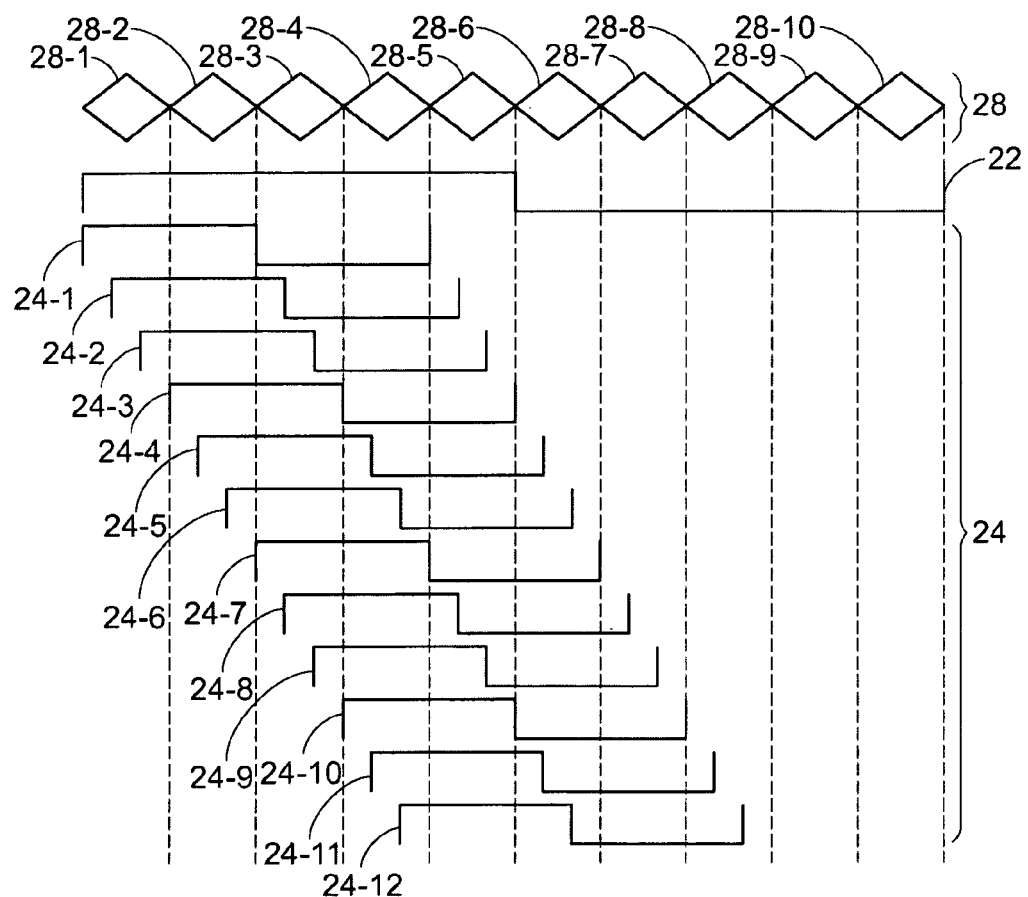
FIG. 2A, FIG. 2B, and FIG. 2C are diagrams illustrating 3× over-sampling data recovery according to prior art.
Figure 2B:
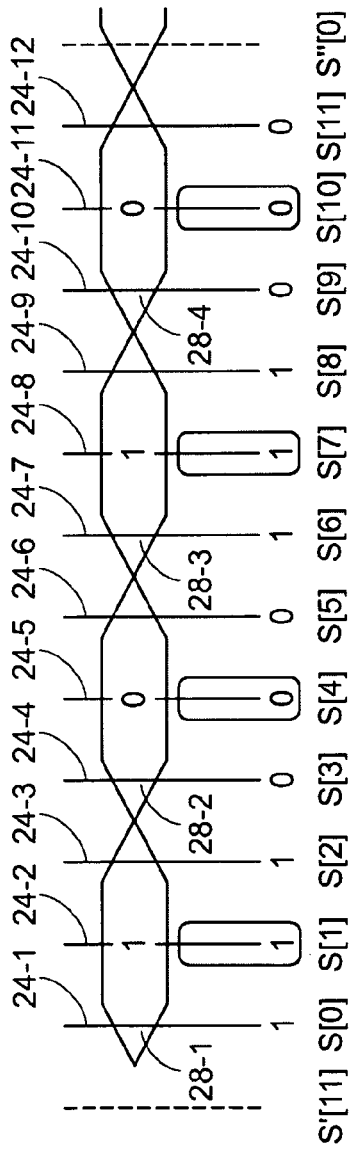
Figure 2C:
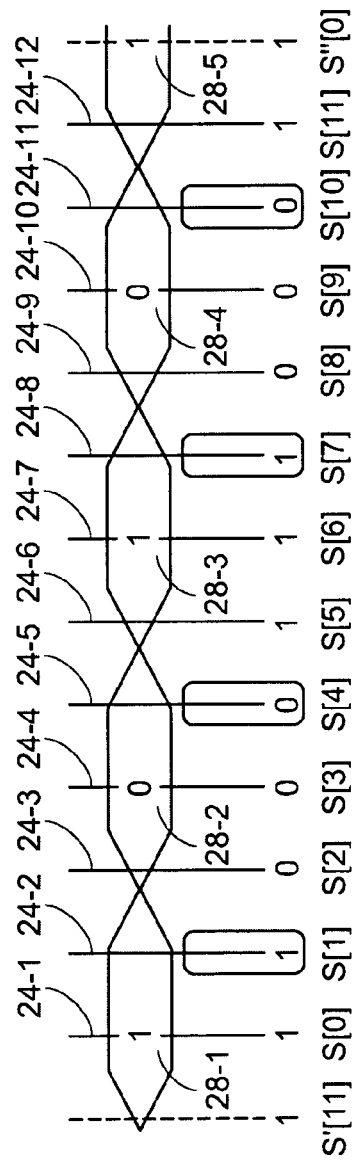
Figure 3:
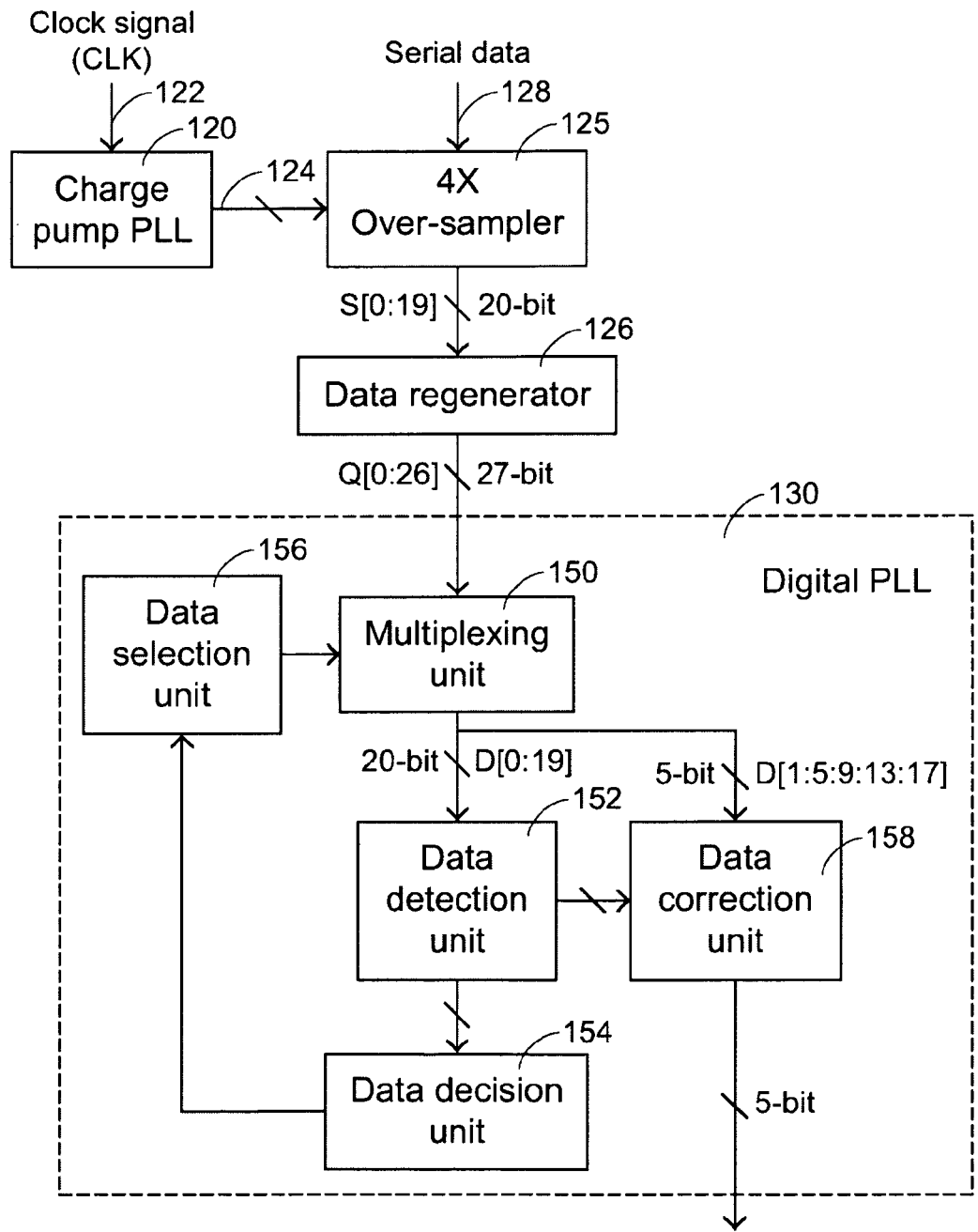
FIG. 3 is a diagram illustrating a 4× over-sampling data recovery system according to an embodiment of the present invention.

Please refer to FIG. 3, which is a diagram illustrating a 4× over-sampling data recovery system according to an embodiment of the present invention. The 4× over-sampling data recovery system consists of a charge pump PLL 120, a 4× over-sampler 125, a data regenerator 126, and a digital PLL 130. The digital PLL 130 further includes a multiplexing unit 150, a data detection unit 152, a data decision unit 154, a data selection unit 156 and a data correction unit 158. In addition, the charge pump PLL 120 receives a clock signal (CLK) 122, and the 4× over-sampler 125 receives a serial data 128, e.g. any one serial data of the three color channels.

According to an embodiment of the present invention, the charge pump PLL 120 receives the clock signal 122, and then generates twenty multiplicative clock signals 124 with a phase difference of 18 degrees to the 4× over-sampler 125 by performing a 2× frequency multiplication on the clock signal 122. The 4× over-sampler 125 samples the serial data 128 according to the multiplicative clock signals 124, so as to generate twenty over-sampled data during a clock cycle, i.e. the 20-bit data S[0:19], to the data regenerator 126.

Figure 4:
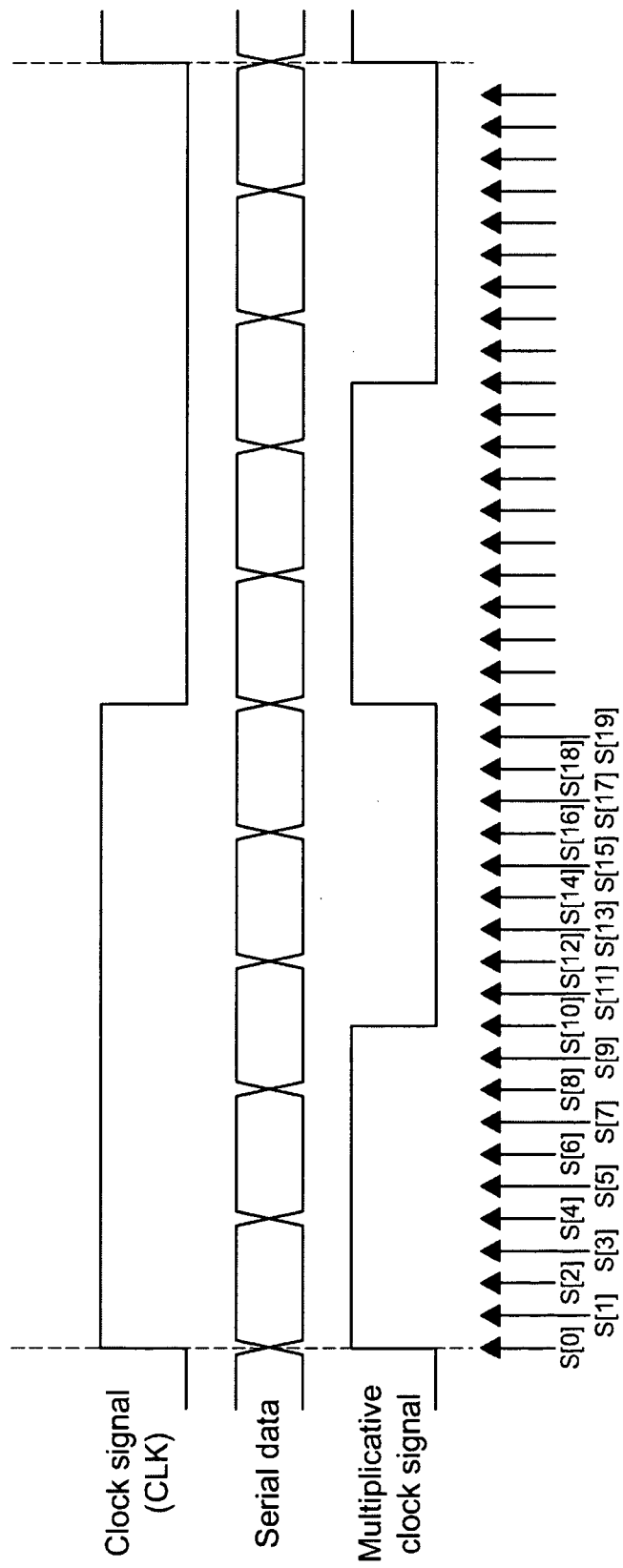
FIG. 4 is a diagram illustrating how a 4× over-sampler samples a serial data according to an embodiment of the present invention.

Please refer to FIG. 4, which is a diagram illustrating how the 4× over-sampler 125 samples a serial data according to an embodiment of the present invention. Since the charge pump PLL 120 receives the clock signal 122 and performs a 2× frequency multiplication on the clock signal 122, a serial data with five bits can be sampled during a multiplicative clock cycle of the multiplicative clock signal, wherein each bit in the serial data is sampled for four times. As shown in FIG. 4, the 20-bit data S[0:19] can be sampled during a multiplicative clock cycle of the multiplicative clock signal.

Furthermore, when the 20-bit data S[0:19] is inputted to the data regenerator 126, the data regenerator 126 outputs a 27-bit data Q[0:26] by adding the latest seven bits S'[13:19] of the previous over-sampled data sampled during the previous clock cycle and the 20-bit data S[0:19] up.

The multiplexing unit 150 receives the 27-bit data Q[0:26] and divides the 27-bit data Q[0:26] into eight groups of 20-bit data, i.e. Q[0:19], Q[1:20], Q[2:21], Q[3:22], Q[4:23], Q[5:

24], Q[6:25], and Q[7:26]. The data selection unit 156 selects one of the eight groups of 20-bit data of the multiplexing unit 150 as a 20-bit data D[0:19] to be inputted to the data detection unit 152. After that, the five bits D[1:5:9:13:17] or D[2:6:10:14:18] can be selected from the 20-bit data D[0:19] as a 5-bit data to be inputted to the data correction unit 158.

Figure 5A:
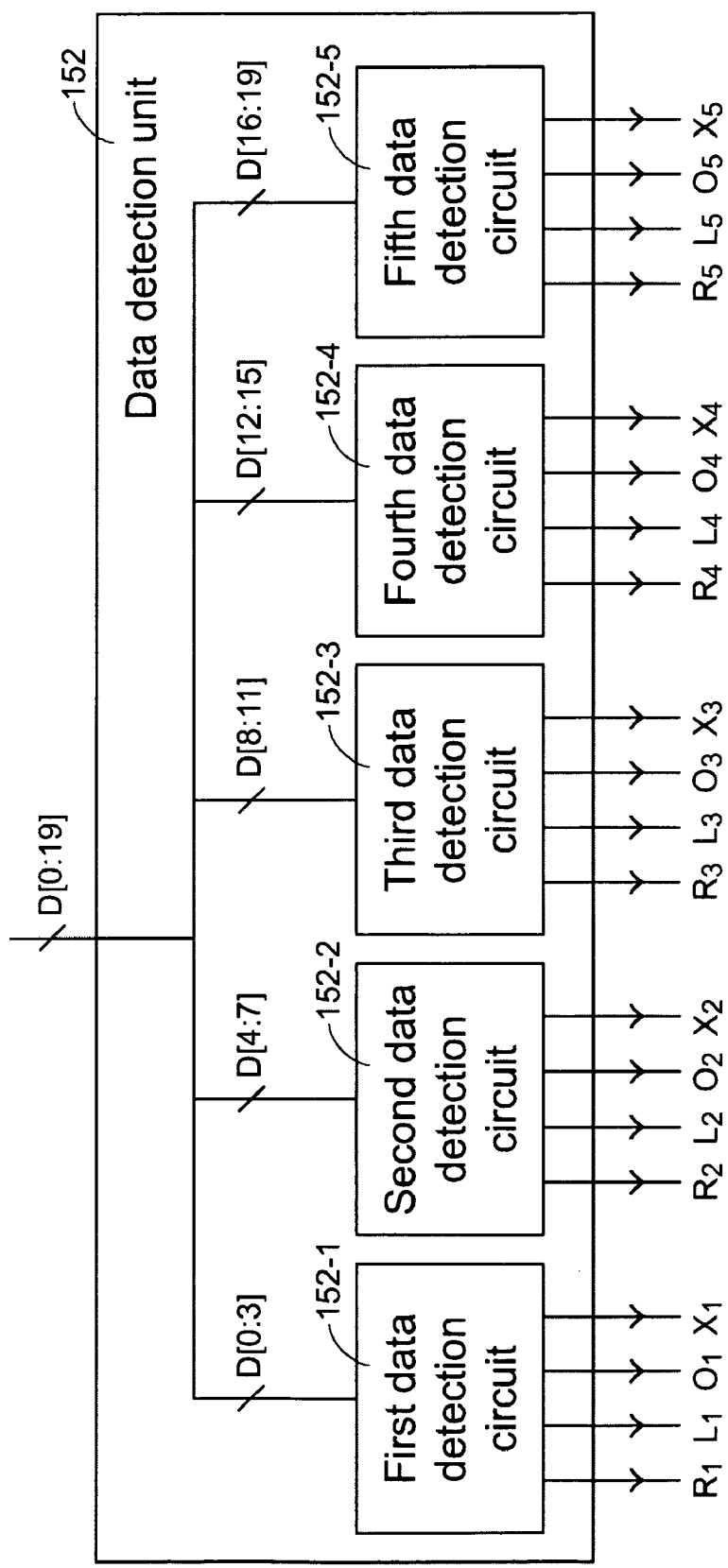
FIG. 5A is a diagram showing an embodiment of a data detection unit applicable to the 4× over-sampling data recovery system of FIG. 3.

Please refer to FIG. 5A. FIG. 5A is a diagram showing an embodiment of a data detection unit 152 applicable to the 4× over-sampling data recovery system of FIG. 3. The data detection unit 152 consists of five identical data detection circuits 152-1~152-5. The first data detection circuit 152-1 receives the four bits D[0:3], the second data detection circuit 152-2 receives the four bits D[4:7], the third data detection circuit 152-3 receives the four bits D[8:11], the fourth data detection circuit 152-4 receives the four bits D[12:15], and the fifth data detection circuit 152-5 receives the four bits D[16:19]. Each data detection circuit can output an accuracy signal, an error signal, a left-shift signal and a right-shift signal according to the received four bits.

Figure 5B:
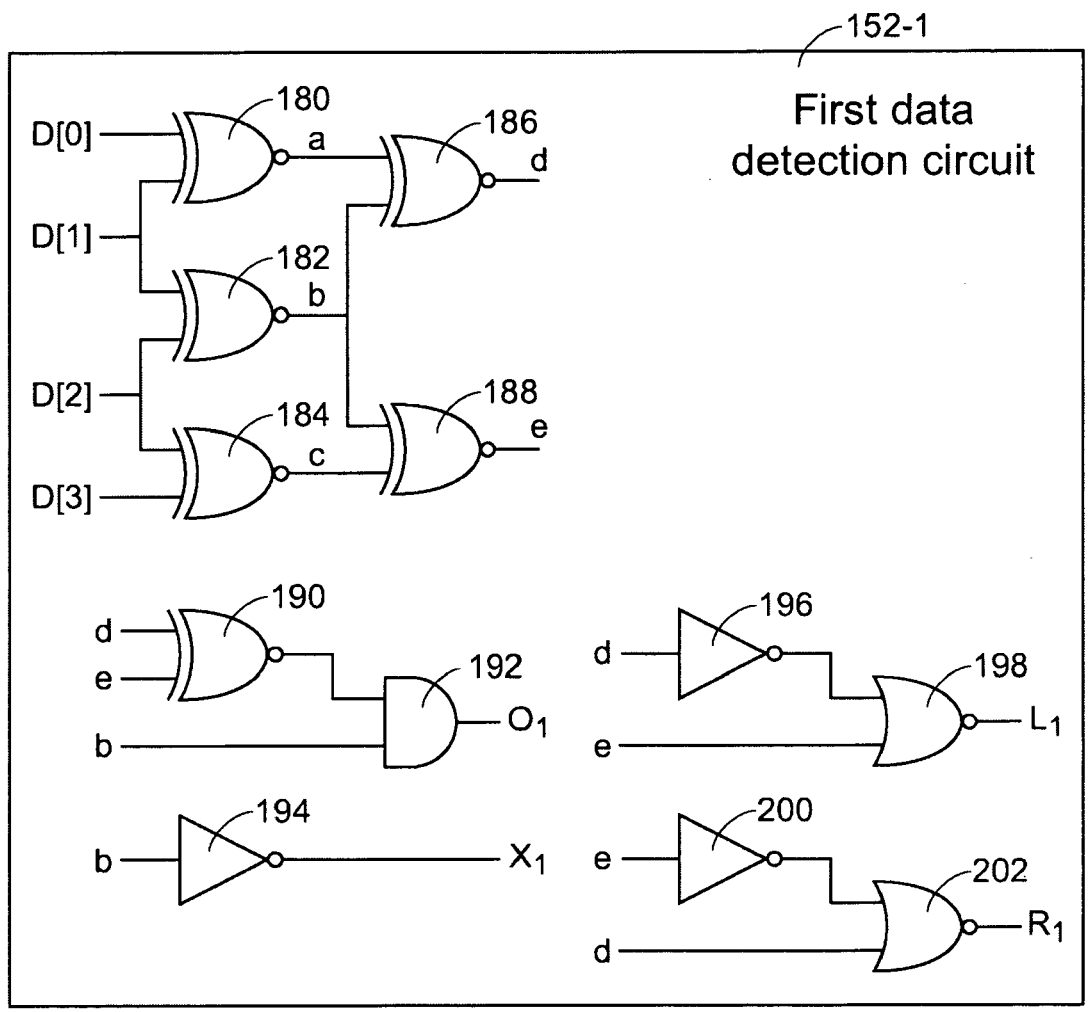
FIG. 5B is a diagram showing an embodiment of a first data detection circuit applicable to the data detection unit of FIG. 5A.

Please refer to FIG. 5B, which is a diagram showing an embodiment of a first data detection circuit 152-1 applicable to the data detection unit 152 of FIG. 5A. Take the first data detection circuit 152-1 as an example, the first data detection circuit 152-1 includes: a first exclusive NOR gate (NXOR) 180, for receiving the bits D[0] and D[1] and generating a signal "a" in response to the bits D[0] and D[1], wherein a=(D[0]+$\overline{D[1]}$)·($\overline{D[0]}$+D[1]); a second exclusive NOR gate (NXOR) 182 for receiving the bits D[1] and D[2] and generating a signal "b" in response to the bits D[1] and D[2], wherein b=(D[1]+$\overline{D[2]}$)·($\overline{D[1]}$+D[2]); a third exclusive NOR gate (NXOR) 184 for receiving the bits D[2] and D[3] and generating a signal "c" in response to the bits D[2] and D[3], wherein c=(D[2]+$\overline{D[3]}$)·($\overline{D[2]}$+D[3]); a fourth exclusive NOR gate (NXOR) 186 for receiving the signals "a" and "b" and generating a signal "d" in response to the signals "a" and "b", wherein d=(a+$\overline{b}$)·($\overline{a}$+b); and a fifth exclusive NOR gate (NXOR) 188 for receiving the signals "b" and "c" and generating a signal "e" in response to the signals "b" and "c", wherein e=(b+$\overline{c}$)·($\overline{b}$+c). In addition, the first accuracy signal O1 can be generated by utilizing a sixth exclusive NOR gate (NXOR) 190 and a first AND gate 192, wherein O1=b·(d+$\overline{e}$)·($\overline{d}$+e); the first error signal X1 can be generated by utilizing a first NOT gate 194, wherein X1=$\overline{b}$; the first left-shift signal L1 can be generated by utilizing a second NOT gate 196 and a first NOR gate 198, wherein L1=d·$\overline{e}$; and the first right-shift signal R1 can be generated by utilizing a third NOT gate 200 and a second NOR gate 202, wherein R1=e·$\overline{d}$.

According to an embodiment of the present invention, when the bits D[0:3] are equal to [0, 0, 0, 0], [1, 1, 1, 1], [1, 0, 0, 1] or [0, 1, 1, 0], the first accuracy signal O1 is logic "1", the first error signal X1 is logic "0", the first left-shift signal L1 is logic "0", and the first right-shift signal is logic "0". When the bits D[0:3] are equal to [0, 0, 0, 1] or [1, 1, 1, 0], the first accuracy signal O1 is logic "0", the first error signal X1 is logic "0", the first left-shift signal L1 is logic "1", and the first right-shift signal is logic "0". When the bits D[0:3] are equal to [1, 0, 0, 0] or [0, 1, 1, 1], the first accuracy signal O1 is logic "0", the first error signal X1 is logic "0", the first left-shift signal L1 is logic "0", and the first right-shift signal is logic "1". Furthermore, when the bits D[0:3] have the values except the abovementioned eight conditions, such as [0, 0, 1, 1] and [1, 1, 0, 0], the first accuracy signal O1 is logic "0", the first error signal X1 is logic "1", the first left-shift signal L1 is logic "0", and the first right-shift signal is logic "0".

In other words, when the first accuracy signal O1 is logic "1", it represents that the inputted bits D[0:3] are correct. When the first error signal X1 is logic "1", it represents that the inputted bits D[0:3] are incorrect. When the first left-shift signal L1 is logic "1", it represents that the sampled data can be shifted left by one bit. When the right-shift signal R1 is logic "1", it represents that the sampled data can be shifted right by one bit.

Figure 6A:
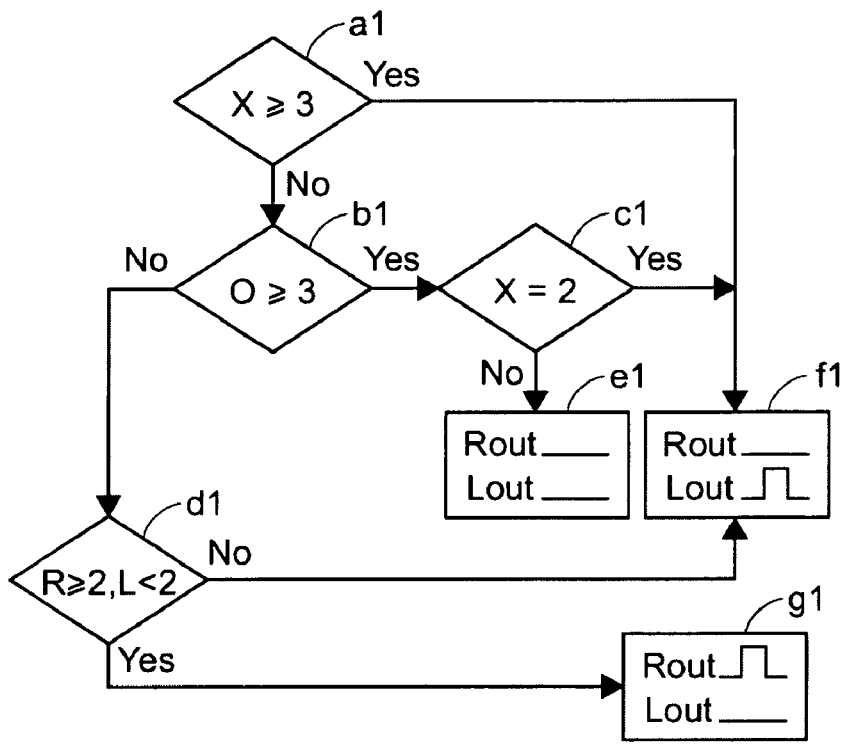
FIG. 6A is a judgment flowchart of the data decision unit according to a first embodiment of the present invention.

Please refer to FIG. 6A. FIG. 6A is a judgment flowchart of the data decision unit 154 according to a first embodiment of the present invention. Since the data decision unit 154 is connected to the data detection unit 152, the data decision unit 154 can determine the adjustment of the sampled data according to a detecting signal set outputted by the data detection unit 152, wherein the five accuracy signals O1~O5, the five error signals X1~X5, the five left-shift signals L1~L5, and the five right-shift signals R1~R5 outputted by the data detection unit 152 are viewed as the detecting signal set.

As can be know from FIG. 6A, when a number of the error signals (X1~X5) equaling logic "1" among the detecting signal set is equal or greater than 3 (the step a1), directly output a left-shift sampling signal Lout (the step f1). Otherwise, when the number of the error signals equaling logic "1" among the detecting signal set is smaller than 3 (the step a1), determine whether a number of the accuracy signals (O1~O5) equaling logic "1" among the detecting signal set is equal or greater than 3 (the step b1).

In addition, when the number of the accuracy signals equaling logic "1" among the detecting signal set is equal or greater than 3 (the step b1), determine whether the number of the error signals equaling logic "1" is equal to 2 (the step c1). When the number of the error signals equaling logic "1" is equal to 2 (the step c1), output a left-shift sampling signal Lout (the step f1). Otherwise, when the number of the error signals equaling logic "1" is not equal to 2 (the step c1), neither the right-shift sampling signal Rout nor the left-shift sampling signal Lout is outputted (the step e1). That is, maintain the original status.

Furthermore, when the number of the accuracy signals equaling logic "1" is smaller than 3 (the step b1), determine whether a condition that a number of the right-shift signals equaling logic "1" is equal or greater than 2 and a number of the left-shift signals equaling logic "1" is smaller than 2 is valid (the step d1). When the condition mentioned in the step d1 is valid, output the right-shift sampling signal Rout (the step g1); otherwise, output the left-shift sampling signal Lout (the step f1).

Figure 6B:
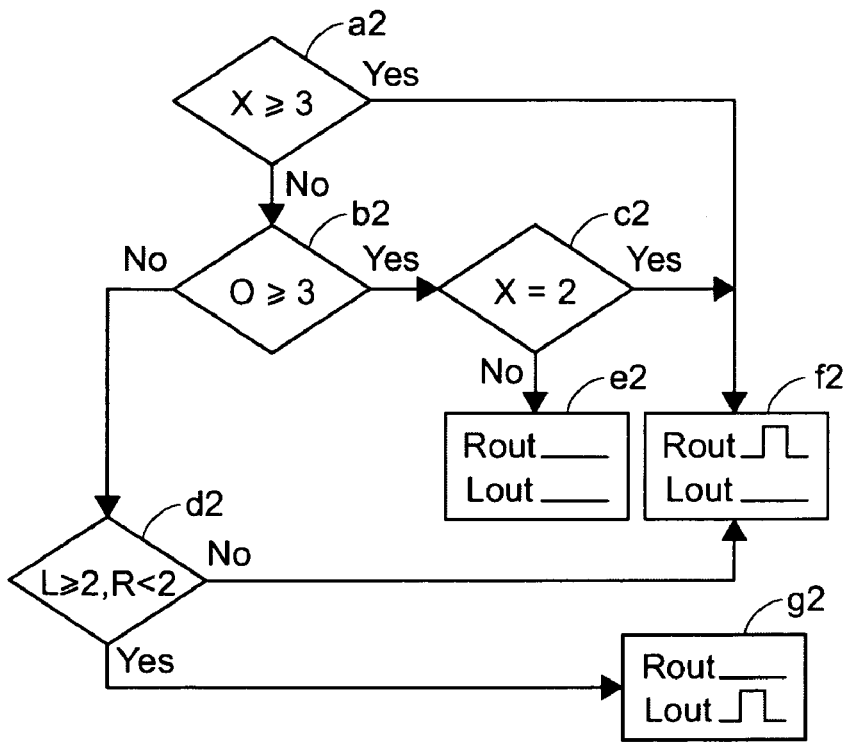
FIG. 6B is a judgment flowchart of the data decision unit according to a second embodiment of the present invention.

Please refer to FIG. 6B. FIG. 6B is a judgment flowchart of the data decision unit according to a second embodiment of the present invention. Since the data decision unit 154 is connected to the data detection unit 152, the data decision unit 154 can determine the adjustment of the sampled data according to a detecting signal set outputted by the data detection unit 152, wherein the five accuracy signals O1~O5, the five error signals X1~X5, the five left-shift signals L1~L5, and the five right-shift signals R1~R5 outputted by the data detection unit 152 are viewed as the detecting signal set.

As can be know from FIG. 6B, when the number of the error signals (X1~X5) equaling logic "1" among the detecting signal set is equal or greater than 3 (the step a2), directly output the right-shift sampling signal Rout (the step f2). Otherwise, when the number of the error signals equaling logic "1" among the detecting signal set is smaller than 3 (the step a2), determine whether the number of the accuracy signals (O1~O5) equaling logic "1" among the detecting signal set is equal or greater than 3 (the step b2).

In addition, when the number of the accuracy signals equaling logic "1" among the detecting signal set is equal or greater than 3 (the step b2), determine whether the number of the error signals equaling logic "1" is equal to 2 (the step c2).

When the number of the error signals equaling logic "1" is equal to 2 (the step c2), output the right-shift sampling signal Rout (the step f2). Otherwise, when the number of the error signals equaling logic "1" is not equal to 2 (the step c2), neither the right-shift sampling signal Rout nor the left-shift sampling signal Lout are outputted (the step e2). That is, maintain the original status.

Furthermore, when the number of the accuracy signals equaling logic "1" is smaller than 3 (the step b2), determine whether a condition that the number of the left-shift signals equaling logic "1" is equal or greater than 2 and the number of the right-shift signals equaling logic "1" is smaller than 2 is valid (the step d2). When the condition mentioned in the step d2 is valid, output the left-shift sampling signal Lout (the step g2); otherwise, output the right-shift sampling signal Rout (the step f2).

Figure 7:
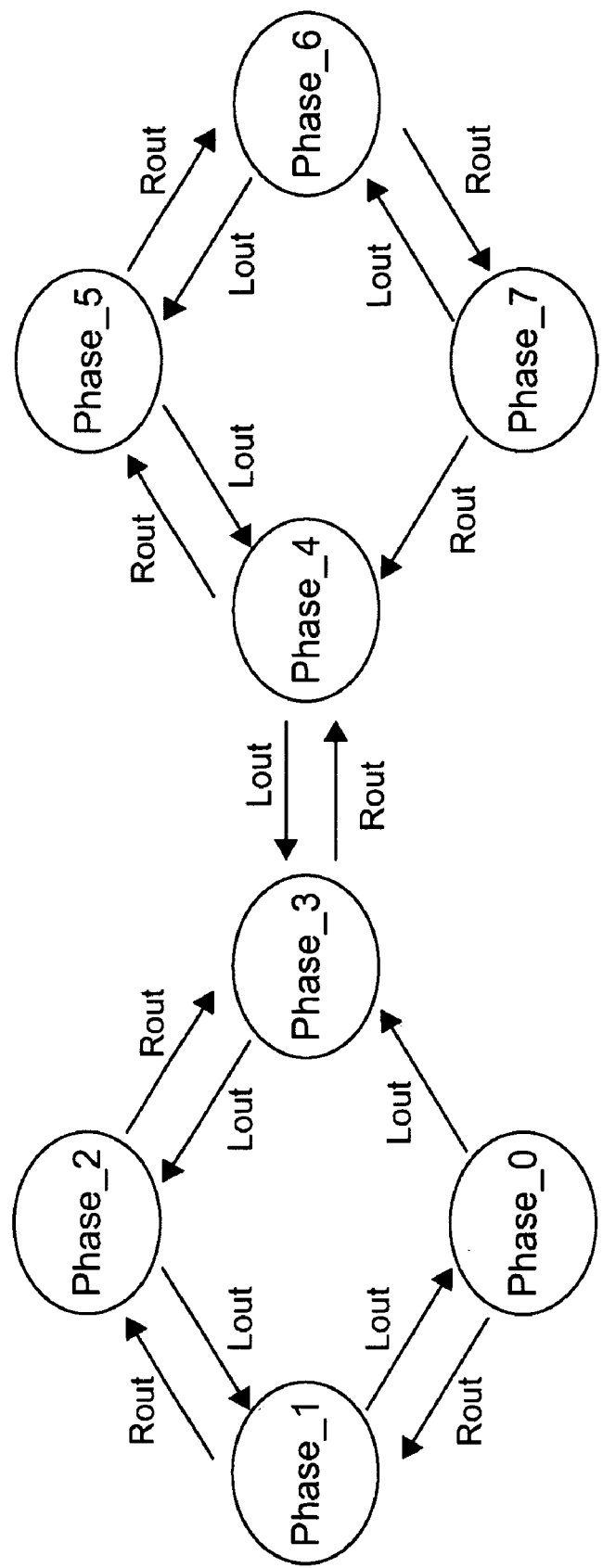
FIG. 7 is a diagram illustrating a phase selection of the data selection unit applicable to the 4× over-sampling data recovery system of FIG. 3.

Please refer to FIG. 7. FIG. 7 is a diagram illustrating a phase selection of the data selection unit 156 applicable to the 4× over-sampling data recovery system of FIG. 3. Since the 27-bit data Q[0:26] is received and divided into eight groups of 20-bit data (i.e. Q[0:19], Q[1:20], Q[2:21], Q[3:22], Q[4:23], Q[5:24], Q[6:25], and Q[7:26]) by the multiplexing unit 150, the eight phases Phase_0~Phase_7 of the data selection unit 156 correspond to the eight groups of 20-bit data of the multiplexing unit 150 respectively. In other words, the data selection unit 156 can output a phase selecting signal to the multiplexing unit 150, and thereby the multiplexing unit 150 can select a designed 20-bit data from the eight groups of 20-bit data. That is, when the data selection unit 156 is in the first phase (Phase_0), the data selection unit 156 controls the multiplexing unit 150 to output the first 20-bit data Q[0:19]. Similarly, the second phase Phase_1 can correspond to the second 20-bit data Q[1:20]. The third phase Phase_2 can correspond to the third 20-bit data Q[2:21], and so on.

A transition relation between all phases can be known from FIG. 7. For example, assume that the data selection unit 156 stays in the first phase Phase_0 in the beginning. If the data decision unit 154 continuously outputs the right-shift sampling signal Rout for seven times, the data selection unit 156 will be sequentially transformed into the eighth phase Phase_7. Similarly, assume that the data selection unit 156 stays in the eighth phase Phase_7 in the beginning. If the data decision unit 154 continuously outputs the left-shift sampling signal Lout for seven times, the data selection unit 156 will be sequentially transformed into the first phase Phase_0.

Figure 8A:
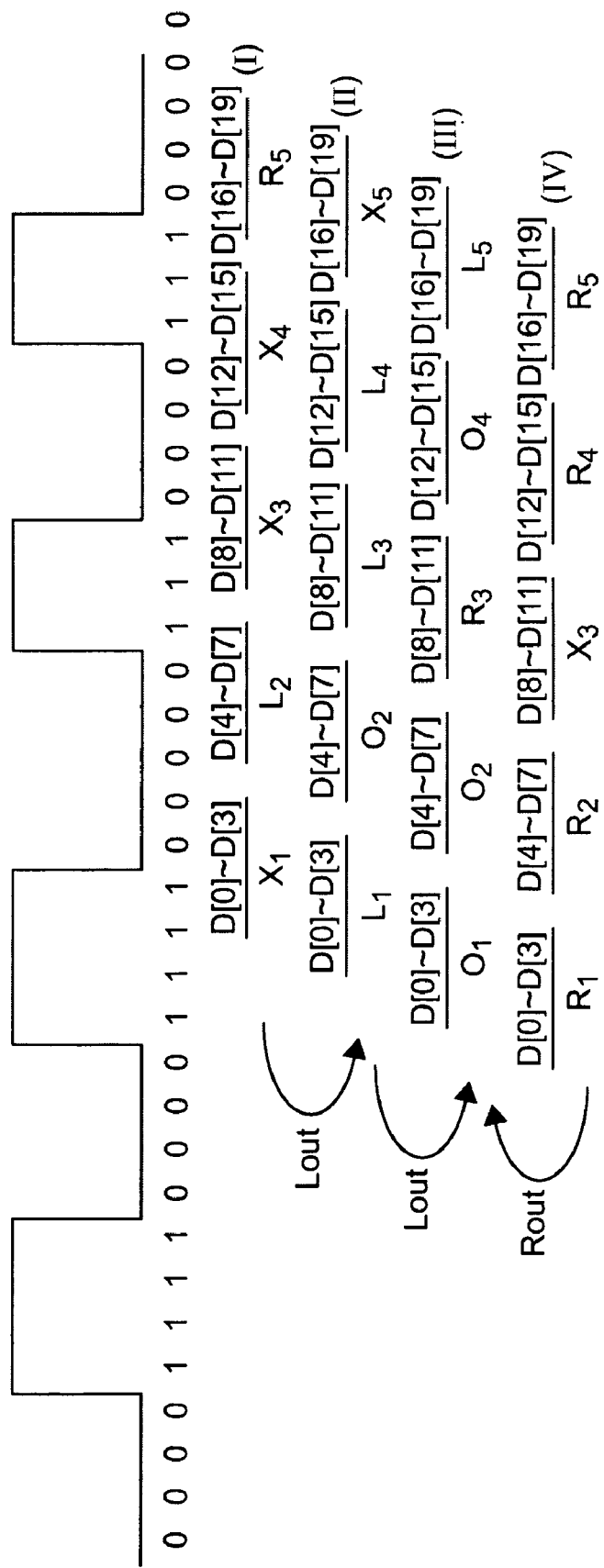
FIG. 8A, FIG. 8B, FIG. 8C and FIG. 8D are diagrams illustrating 4× over-sampling data recovery according to an embodiment of the present invention.

Please refer to FIG. 8A. FIG. 8A is a diagram illustrating 4× over-sampling data recovery according to an embodiment of the present invention. Assume that the serial data has interlaced "0" and "1", and it stays in a non-ideal case. If a condition (I) represents that the multiplexing unit 150 outputs the 20-bit data D[0:19], three error signals (X1, X3, and X4), one left-shift signal (L2), and one right-shift signal (R5) are outputted by the five data detection circuits 152-1~152-5 of the data detection unit 152. As a result, one left-shift sampling signal Lout is generated by the data decision unit 154 in the first embodiment, which makes a condition (II) represent that the multiplexing unit 150 outputs the 20-bit data D[0:19].

If the condition (II) represents that the multiplexing unit 150 outputs the 20-bit data D[0:19], three left-shift signal (L1, L3, and L4), one accuracy signal (O2), and one error signal (X5) are outputted by the five data detection circuits 152-1~152-5 of the data detection unit 152. As a result, one left-shift sampling signal Lout is generated by the data decision unit 154 in the first embodiment, which makes a condition (III) represent that the multiplexing unit 150 outputs the 20-bit data D[0:19].

If the condition (III) represents that the multiplexing unit 150 outputs the 20-bit data D[0:19], three accuracy signals (O1, O2, and O4), one right-shift signal (R3), and one left-shift signal (L5) are outputted by the five data detection circuits 152-1~152-5 of the data detection-unit 152. As a result, neither the right-shift sampling signal Rout nor the left-shift sampling signal Lout is outputted by the data decision unit 154 in the first embodiment, which maintains the original status.

Moreover, if a condition (IV) represents that the multiplexing unit 150 outputs the 20-bit data D[0:19], four right-shift signals (R1, R2, R4, and R5) and one error signals (X3) are outputted by the five data detection circuits 152-1~152-5 of the data detection unit 152. As a result, one right-shift sampling signal Rout is outputted by the data decision unit 154 in the first embodiment, which makes the condition (III) represent that the multiplexing unit 150 outputs the 20-bit data D[0:19].

Figure 8B:
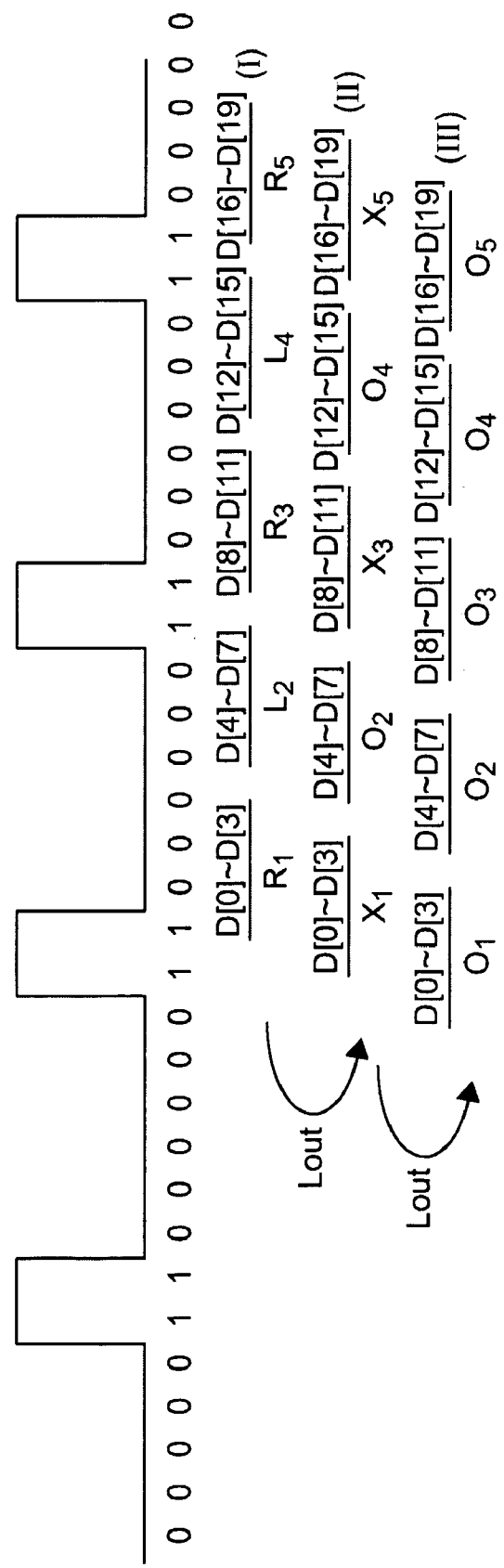
Figure 8C:
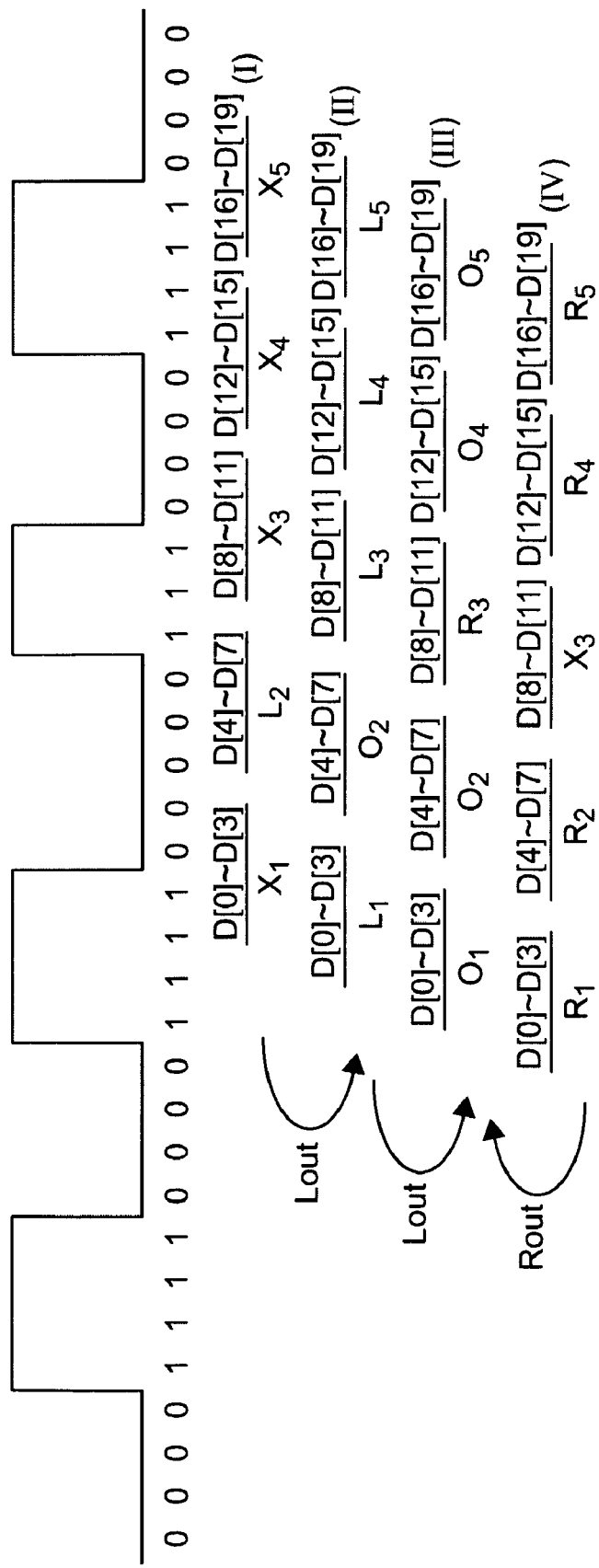
Figure 8D:
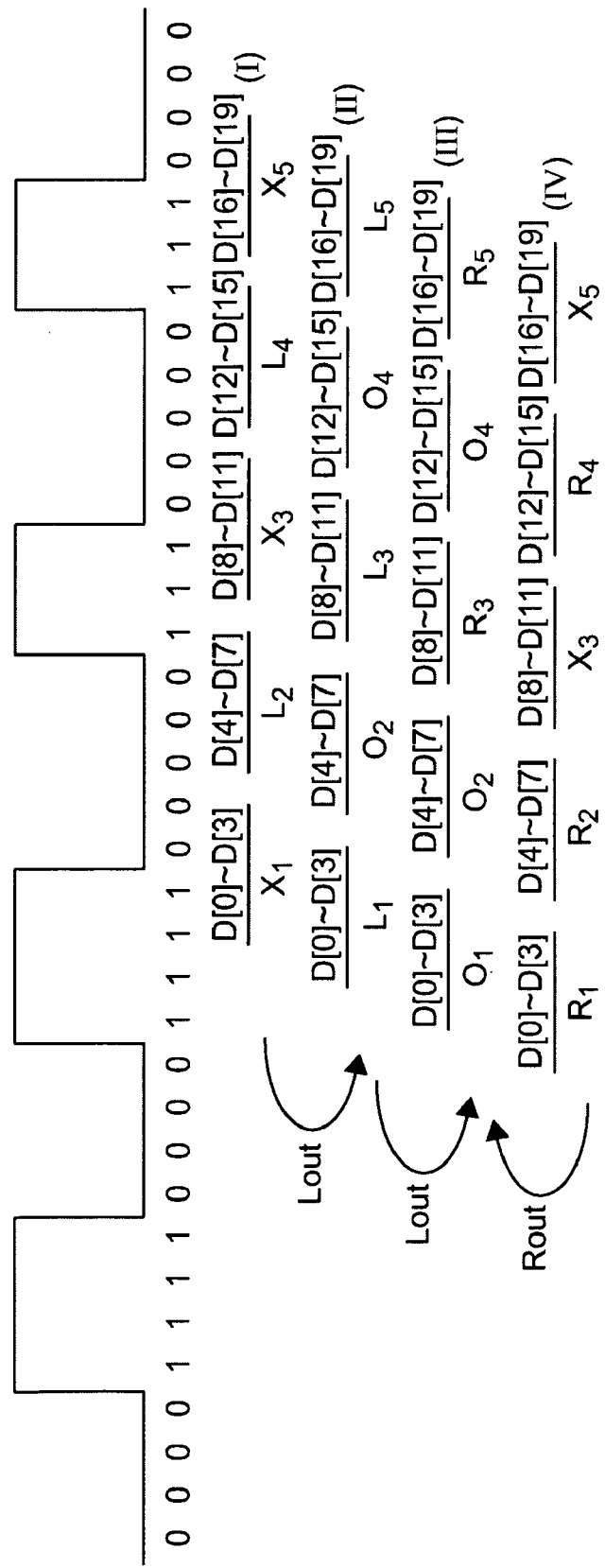

Similarly, FIG. 8B, FIG. 8C, and FIG. 8D are diagrams illustrating 4× over-sampling data recovery for various non-ideal cases according to the present invention. Due to their principles being the same, and further detailed description is omitted herein for brevity.

Figure 9:
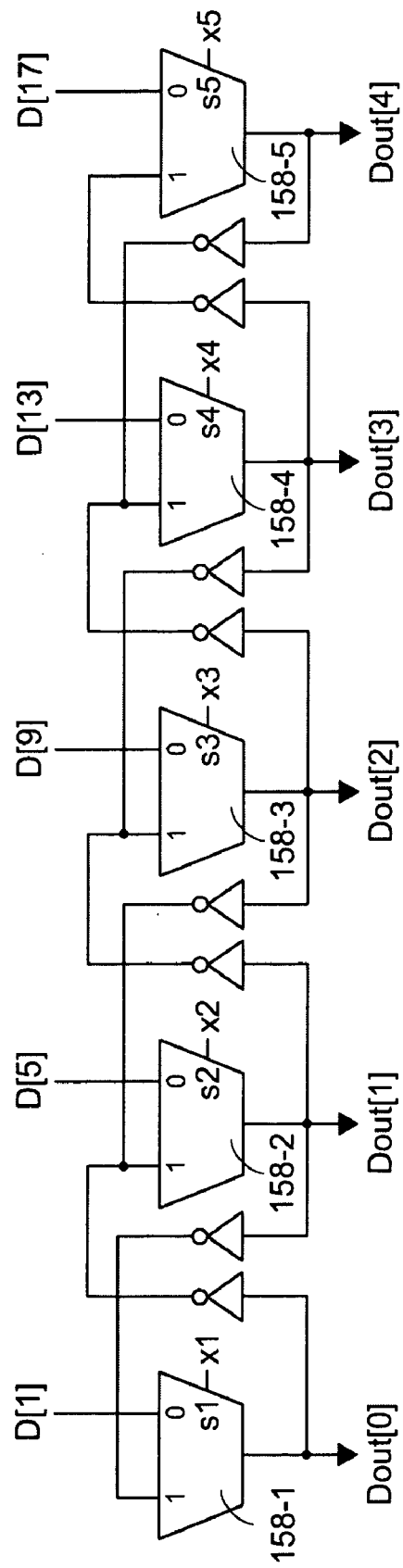
FIG. 9 is a diagram showing an embodiment of a data correction unit applicable to the 4× over-sampling data recovery system of FIG. 3.

According to an embodiment of the present invention, the five bits D[1:5:9:13:17] or D[2:6:10:14:18] can be selected from the 20-bit data D[0:19] of the multiplexing unit 150 as a 5-bit data to be inputted to the data correction unit 158. Please refer to FIG. 9. FIG. 9 is a diagram showing an embodiment of the data correction unit 158 applicable to the 4× over-sampling data recovery system of FIG. 3. The data correction unit 158 consists of five multiplexer 158-1~158-5, wherein each of the multiplexers 158-1~158-5 includes a selecting terminal, a zero-input terminal, an one-input terminal, and an output terminal. The data Dout[0], Dout[1], Dout[2], Dout[3], and Dout[4] outputted by the output terminals of the five multiplexers 158-1~158-5 represent the recovered 5-bit data.

The selecting terminal S1 of the first multiplexer 158-1 receives the first error signal X1; the selecting terminal S2 of the second multiplexer 158-2 receives the second error signal X2; the selecting terminal S3 of the third multiplexer 158-3 receives the third error signal X3; the selecting terminal S4 of the fourth multiplexer 158-4 receives the fourth error signal X4; and the selecting terminal S5 of the fifth multiplexer 158-5 receives the fifth error signal X5.

In addition, the zero-input terminal (0) of the first multiplexer 158-1 receives the data of D[1]; the zero-input terminal (0) of the second multiplexer 158-2 receives the data of D[5]; the zero-input terminal (0) of the third multiplexer 158-3 receives the data of D[9]; the zero-input terminal (0) of the fourth multiplexer 158-4 receives the data of D[13]; and the zero-input terminal (0) of the fifth multiplexer 158-5 receives the data of D[17].

Moreover, the one-input terminal (1) of the first multiplexer 158-1 receives an inverted data of Dout[1] (i.e. $\overline{Dout[1]}$) outputted by the second multiplexer 158-2. The one-input terminal (1) of the second multiplexer 158-2 receives an inverted data of Dout[0] (i.e. $\overline{Dout[0]}$) outputted by the first multiplexer 158-1 and an inverted data of Dout[2] (i.e. $\overline{Dout[2]}$) outputted by the third multiplexer 158-3. The one-input terminal (1) of the third multiplexer 158-3 receives an inverted data of Dout[1] (i.e. $\overline{Dout[1]}$) outputted by the second multiplexer 158-2 and an inverted data of Dout[3] (i.e. $\overline{Dout[3]}$) outputted by the fourth multiplexer 158-4. The one-input terminal (1) of the fourth multiplexer 158-4 receives an inverted data of Dout[2] (i.e. $\overline{Dout[2]}$) outputted by the third multiplexer 158-3 and an inverted data of Dout[4] (i.e. $\overline{Dout[4]}$) outputted by the fifth multiplexer 158-5. The one-input terminal (1) of the fifth multiplexer 158-5 receives an inverted data of Dout[3] (i.e. $\overline{\text{Dout}[3]}$) outputted by the fourth multiplexer 158-4.

Obviously, when all of the error signals X1~X5 are equal to logic "0", it represents that the data D[1:5:9:13:17] received by the zero-input terminals of the multiplexers 158-1~158-5 are the recovered data Dout[0:4]. On the contrary, if the first error signal X1 is equal to logic "1", it represents that the data D[1] received by the zero-input terminal of the first multiplexer 158-1 is incorrect. At this time, the first multiplexer 158-1 must select the inverted data of Dout[1] outputted by the second multiplexer 158-2 as the its output data. Namely, Dout[0]=$\overline{\text{Dout}[1]}$. In other words, when the error signal is active, the corresponding data will be corrected according to the former bit or the next bit.

It is understood from the above descriptions that a 4× over-sampling data recovery method and system can be used to sample serial data in color channels of the video interface, such as JDMI (High-Definition Multimedia Interface) and DVI (Digital Visual Interface). According to the present invention, when the sampled data stays in the non-ideal case, the sampled data of the multiplexers can be adjusted by the 4× over-sampling data recovery method and system disclosed in the present invention. Therefore, the data accuracy of the sampled data can be substantially improved. Furthermore, the incorrect data can be corrected by utilizing the data correction unit disclosed in the present invention.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A 4× over-sampling data recovery system, comprising:
   a charge pump phase locked loop (PLL), for receiving a clock signal and generating a plurality of multiplicative clock signals according to the clock signal;
   a 4× over-sampler, for sampling a serial data to generate a M-bit signal according to the plurality of multiplicative clock signals, wherein each bit in the serial data is sampled for four times;
   a data regenerator for generating a (M+N)-bit signal according to sequentially combining two of the M-bit signals received; and
   a digital PLL, for dividing the (M+N)-bit signal into (N+1) groups of M-bit data and selecting a designated M-bit data from the (N+1) groups of M-bit data as a P-bit recovery data.

2. The 4× over-sampling data recovery system of claim 1, wherein the digital PLL comprises:
   a multiplexing unit, for receiving the (M+N)-bit signal and selecting the designated M-bit data from the (N+1) groups of M-bit data according to a phase selecting signal;
   a data detection unit, for generating a detecting signal set in response to the P-bit recovery data among the designated M-bit data;
   a data decision unit, for generating one of a right-shift sampling signal and a left-shift sampling signal in response to the detecting signal set;
   a data selection unit, for increasing the phase selecting signal when the right-shift sampling signal is active and decreasing the phase selecting signal when the left-shift sampling signal is active; and
   a data correction unit, for generating the P-bit recovery data according to the detecting signal set.

3. The 4× over-sampling data recovery system of claim 2, wherein the data detection unit comprises five data detection circuits, for respectively selecting a four-bit data among the designated M-bit data to generate an accuracy signal, an error signal, a left-shift signal and a right-shift signal, wherein the detecting signal set includes the accuracy signal, the error signal, the left-shift signal and the right-shift signal.

4. The 4× over-sampling data recovery system of claim 3, wherein each data detection circuit comprises:
   a first exclusive NOR gate, for generating a signal "a" in response to a first bit data and a second bit data of the four-bit data;
   a second exclusive NOR gate, for generating a signal "b" in response to the second bit data and a third bit data of the four-bit data;
   a third exclusive NOR gate, for generating a signal "c" in response to the third bit data and a fourth bit data of the four-bit data;
   a fourth exclusive NOR gate, for generating a signal "d" in response to the signal "a" and the signal "b";
   a fifth exclusive NOR gate, for generating a signal "e" in response to the signal "b" and the signal "c";
   a sixth exclusive NOR gate for receiving the signal "d" and the signal "e";
   an AND gate, connected to an output terminal of the sixth exclusive NOR gate, for outputting the accuracy signal in response to a signal outputted by the output terminal of the sixth exclusive NOR gate and the signal "b";
   a first NOT gate, for outputting the error signal in response to the signal "b";
   a second NOT gate, for receiving the signal "d";
   a first NOR gate, connected to an output terminal of the second NOT gate, for outputting the left-shift signal in response to a signal outputted by the output terminal of the second NOT gate and the signal "e";
   a third NOT gate, for receiving the signal "e"; and
   a second NOR gate, connected to an output terminal of the third NOT gate, for outputting the right-shift signal in response to a signal outputted by the output terminal of the third NOT gate and the signal "d".

5. The 4× over-sampling data recovery system of claim 2, wherein the data decision unit processes according to the following steps:
   when a number of the active error signals among the detecting signal set is equal or greater than 3, outputting the left-shift sampling signal, otherwise, determining whether a number of the active accuracy signals among the detecting signal set is equal or greater than 3;
   when the number of the active accuracy signals among the detecting signal set is equal or greater than 3, and the number of the active error signals is equal to 2, outputting the left-shift sampling signal, otherwise, when the number of the active error signals is not equal to 2, neglecting outputting the right-shift sampling signal and the left-shift sampling signal; and
   when the number of the active accuracy signals is smaller than 3, and a number of the active right-shift signals is equal or greater than 2 and a number of the active left-shift signals is smaller than 2, outputting the right-shift sampling signal, otherwise, outputting the left-shift sampling signal.

6. The 4× over-sampling data recovery system of claim 2, wherein the data decision unit processes according to the following steps:

when a number of the active error signals among the detecting signal set is equal or greater than 3, outputting the right-shift sampling signal;

when the number of the active error signals among the detecting signal set is smaller than 3, determining whether a number of the active accuracy signals among the detecting signal set is equal or greater than 3;

when the number of the active accuracy signals among the detecting signal set is equal or greater than 3, determining whether the number of the active error signals is equal to 2;

when the number of the active error signals is equal to 2, outputting the right-shift sampling signal;

when the number of the active error signals is not equal to 2, neglecting outputting the right-shift sampling signal and the left-shift sampling signal; and when the number of the active accuracy signals is smaller than 3, and a number of the active left-shift signals is equal or greater than 2 and a number of the active right-shift signals is smaller than 2, outputting the left-shift sampling signal, otherwise, outputting the right-shift sampling signal.

7. The 4× over-sampling data recovery system of claim 1, wherein the designated M-bit data comprises twenty bits and the P-bit recovery data comprises five bits, wherein a second bit data, a sixth bit data, a tenth bit data, a fourteenth bit data and an eighteenth bit data among the designated M-bit data are used as the P-bit recovery data.

8. The 4× over-sampling data recovery system of claim 1, wherein the designated M-bit data comprises twenty bits and the P-bit recovery data comprises five bits, wherein a third bit data, a seventh bit data, a eleventh bit data, a fifteenth bit data and a nineteenth bit data among the designated M-bit data are used as the P-bit recovery data.

9. A 4× over-sampling data recovery method applied to a video interface, comprising the following steps:

receiving a clock signal, and generating a plurality of multiplicative clock signals in response to the clock signal;

sampling a serial data to generate a M-bit signal according to the plurality of multiplicative clock signals, wherein each bit in the serial data is sampled for four times;

sequentially receiving and combining two of the M-bit signals to generate a (M+N)-bit signal;

dividing the (M+N)-bit signal into (N+1) groups of M-bit data;

selecting a designated M-bit data from the (N+1) groups of M-bit data; and generating a P-bit recovery data in response to the designated M-bit data.

10. The 4× over-sampling data recovery method of claim 9, further comprising the following steps:

selecting the designated M-bit data from the (N+1) groups of M-bit data according to a phase selecting signal;

generating a detecting signal set in response to the P-bit recovery data among the designated M-bit data;

generating a right-shift sampling signal or a left-shift sampling signal according to the detecting signal set;

increasing the phase selecting signal when the right-shift sampling signal is active; and decreasing the phase selecting signal when the left-shift sampling signal is active.

11. The 4× over-sampling data recovery method of claim 9, the video interface is a High-Definition Multimedia Interface or a Digital Visual Interface.

* * * * *